United States Patent
Knaipp

(10) Patent No.: US 9,722,047 B2
(45) Date of Patent: Aug. 1, 2017

(54) METHOD OF PRODUCING A HIGH-VOLTAGE TRANSISTOR

(71) Applicant: ams AG, Unterpremstaetten (AT)

(72) Inventor: Martin Knaipp, Unterpremstaetten (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 15/147,860

(22) Filed: May 5, 2016

(65) Prior Publication Data

US 2016/0247898 A1    Aug. 25, 2016

Related U.S. Application Data

(62) Division of application No. 14/385,487, filed as application No. PCT/EP2013/051499 on Jan. 25, 2013, now Pat. No. 9,362,395.

(30) Foreign Application Priority Data

Mar. 16, 2012    (EP) .................... 12159949

(51) Int. Cl.
*H01L 29/76*    (2006.01)
*H01L 29/66*    (2006.01)
(Continued)

(52) U.S. Cl.
CPC ...... *H01L 29/66659* (2013.01); *H01L 21/266* (2013.01); *H01L 21/26513* (2013.01);
(Continued)

(58) Field of Classification Search
CPC . H01L 29/76; H01L 29/0619; H01L 29/7823; H01L 29/0634; H01L 29/0649
See application file for complete search history.

(56) References Cited

U.S. PATENT DOCUMENTS 6,693,340 B1    2/2004  Amaratunga et al.
6,777,746 B2    8/2004  Kitagawa et al.
(Continued)

FOREIGN PATENT DOCUMENTS

CN    101828253 A    9/2010
DE    4309764 A1    9/1994
GB    2380056 A    3/2003
WO    WO-2009/050669 A2    4/2009

OTHER PUBLICATIONS

Heringa, A. et al., "Novel power transistor design for a process independent high voltage option in standard CMOS", Proceedings of the 18th International Symposium on Power Semiconductor Devices & IC's, Jun. 2006, pp. 1-4.

*Primary Examiner* — Phuc Dang
(74) *Attorney, Agent, or Firm* — McDermott Will & Emery LLP

(57) ABSTRACT

The high-voltage transistor device comprises a semiconductor substrate (1) with a source region (2) of a first type of electrical conductivity, a body region (3) including a channel region (4) of a second type of electrical conductivity opposite to the first type of conductivity, a drift region (5) of the first type of conductivity, and a drain region (6) of the first type of conductivity extending longitudinally in striplike fashion from the channel region (4) to the drain region (6) and laterally confined by isolation regions (9). The drift region (5) comprises a doping of the first type of conductivity and includes an additional region (8) with a net doping of the second type of conductivity to adjust the electrical properties of the drift region (5). The drift region depth and the additional region depth do not exceed the maximal depth (17) of the isolation regions (9).

8 Claims, 3 Drawing Sheets

(51) Int. Cl.
*H01L 29/78* (2006.01)
*H01L 29/06* (2006.01)
*H01L 21/266* (2006.01)
*H01L 29/10* (2006.01)
*H01L 21/265* (2006.01)
*H01L 29/08* (2006.01)

(52) U.S. Cl.
CPC ...... *H01L 29/0634* (2013.01); *H01L 29/0649* (2013.01); *H01L 29/0653* (2013.01); *H01L 29/0865* (2013.01); *H01L 29/0882* (2013.01); *H01L 29/1095* (2013.01); *H01L 29/66681* (2013.01); *H01L 29/7816* (2013.01); *H01L 29/7823* (2013.01); *H01L 29/7835* (2013.01)

(56) References Cited

U.S. PATENT DOCUMENTS

| | | | |
|---|---|---|---|
| 2003/0132450 A1* | 7/2003 | Minato | H01L 29/0619 257/110 |
| 2003/0143800 A1 | 7/2003 | Hall et al. | |
| 2006/0194392 A1* | 8/2006 | Nagaoka | H01L 29/0634 438/268 |
| 2007/0096245 A1* | 5/2007 | Kariyama | H01L 21/26586 257/496 |
| 2009/0140343 A1* | 6/2009 | Feilchenfeld | H01L 29/407 257/367 |
| 2010/0213517 A1 | 8/2010 | Sonsky et al. | |
| 2013/0234246 A1* | 9/2013 | Yang | H01L 21/76224 257/335 |

* cited by examiner

METHOD OF PRODUCING A HIGH-VOLTAGE TRANSISTOR

CROSS-REFERENCE TO RELATED APPLICATIONS

The present application is a divisional of U.S. patent application Ser. No. 14/385,487 filed Sep. 15, 2014, U.S. Pat. No. 9,362,395, which is the national stage of International Application No. PCT/EP2013/051499, filed on Jan. 25, 2013, which claims the benefit of priority of European Patent Application No. 12159949.2, filed on Mar. 16, 2012, all of which are hereby incorporated by reference in their entirety for all purposes.

DESCRIPTION

The invention relates to a high-voltage transistor device which can be implemented in a low-voltage CMOS technology, and a method of producing the transistor device.

An increasing range of applications of high-voltage devices makes use of CMOS circuits, which are designed for low voltages. Small channel lengths of low-voltage transistors are achieved by means of high dopant concentrations at the device surface, which do not allow to obtain the condition of RESURF (REduced SURface Field) and high breakdown voltages of the high-voltage devices. An integration of high-voltage and low-voltage devices is desired in order to reduce the costs of manufacturing, but then alignment steps using additional masks, which are not required by the low-voltage devices alone, may be necessary. If the intended application of a high-voltage transistor does not require large low-ohmic drivers, an integration of high- and low-voltage transistors without any additional process lithography alignment steps is the preferred solution.

WO 2009/050669 A2 and corresponding US 2010/0213517 A1 describe an implementation of medium/high-voltage semiconductor devices within a CMOS technology. A semiconductor region provided as a drift region is arranged between dielectric regions, which may be STI (shallow trench isolation) regions. Electrically conductive gate extensions, which may be striplike or tapered polysilicon fingers or field plates, are arranged above the dielectric regions and form capacitors with the semiconductor region and the intermediate sections of the dielectric regions. The gate extensions generate a distribution of the electrical potential which is intended to help deplete the drift region even if its dopant concentration is higher than usual. The depletion may not suffice if the voltage drops mainly between the gate extensions and the drift region, owing to the high dielectric constant of the dielectric regions and the high conductivity of the drift region.

It is an object of the present invention to provide a high-voltage transistor device that can be manufactured within a standard process for low-voltage devices and to disclose a method of production for this high-voltage transistor device.

This object is achieved with the high-voltage transistor device according to claim 1 and with the method of producing the high-voltage transistor device according to claim 10. Embodiments and variants derive from the dependent claims.

The high-voltage transistor device comprises a semiconductor substrate, a source region and a drain region of a first type of electrical conductivity arranged in the substrate at a distance from one another, a channel region of a second type of electrical conductivity, which is opposite to the first type of electrical conductivity, arranged between the source region and the drain region, a striplike drift region longitudinally extending from the channel region to the drain region, and isolation regions laterally confining the drift region transverse to its longitudinal extension. The drift region comprises a doping of the first type of conductivity and includes an adjustment region with a net doping of the second type of conductivity. The drift region and the adjustment region do not exceed the maximal depth of the isolation regions.

In an embodiment of the high-voltage transistor device the adjustment region is tapered to have different lateral widths in such a way that the lateral widths of the adjustment region decrease in the direction from the channel region towards the drain region.

In a further embodiment the isolation regions are shallow trench isolations. The isolation regions may instead be formed by other means, especially as field oxide regions.

In further embodiments the isolation regions are spaced apart by a distance in the range between 0.3 µm and 0.7 µm or more specifically in the smaller range between 0.4 µm and 0.6 µm. This distance may be equal to a maximal lateral width of the adjustment region.

In a further embodiment a drain contact region of the first type of conductivity is arranged at the drain region, the drift region abutting the drain contact region, and the adjustment region is arranged at a distance from the drain contact region.

In further embodiments a plurality of drift regions of the first type of conductivity are arranged parallel to one another and separated by isolation regions, the drift regions comprising a doping of the first type of conductivity and including adjustment regions with a net doping of the second type of conductivity. The drift regions and the adjustment regions do not exceed a maximal depth of the isolation regions.

In a further embodiment the adjustment regions are tapered to have different lateral widths in such a way that the lateral widths of the adjustment regions decrease in the direction from the channel region towards the drain region.

In a method of producing the high-voltage transistor device, isolation regions confining a striplike area are formed in a semiconductor substrate, a drain region of a first type of electrical conductivity and a body region of a second type of electrical conductivity, which is opposite to the first type of conductivity, are formed at opposite ends of the striplike area, and a gate electrode is formed above the body region. A dopant for the first type of conductivity is implanted in the striplike area in such a way that the dopant does not exceed the maximal depth of the isolation regions. A source region of the first type of conductivity is formed in the body region. A dopant for the second type of conductivity is implanted in the striplike area in such a way that the dopant does not exceed the maximal depth of the isolation regions and a net doping of the second type of conductivity is obtained in an adjustment region.

In a variant of the method the adjustment region is formed using a particular mask to implant the dopant for the second type of conductivity in the striplike area. The opening of the mask is limited by an oblique edge, which runs across the striplike area neither in parallel nor perpendicularly to the longitudinal extension of the striplike area.

In a further variant of the method the adjustment region is formed using a mask that completely covers the gate electrode.

In a further variant of the method the implantations of the dopants for the first and second types of conductivity in the striplike area between the isolation regions are performed in a way that is self-aligned with respect to the gate electrode.

In further variants of the method a plurality of isolation regions are arranged parallel to one another confining a plurality of parallel striplike areas. A dopant for the first type of conductivity is implanted in the striplike areas to a maximal depth that does not exceed the maximal depth of the isolation regions, and a dopant for the second type of conductivity is implanted in the striplike areas to a maximal depth that does not exceed the maximal depth of the isolation regions in such a way that a net doping of the second type of conductivity is obtained in adjustment regions.

In a further variant of the method the implantation of the dopant for the second type of conductivity in the striplike areas is performed by means of a mask having a plurality of parallel edges each traversing one of the striplike areas in a direction that is oblique to a longitudinal extension of the striplike area.

The following is a further explanation of the invention and its advantages by a detailed description of exemplary embodiments in conjunction with the accompanying drawings.

Figure 1:
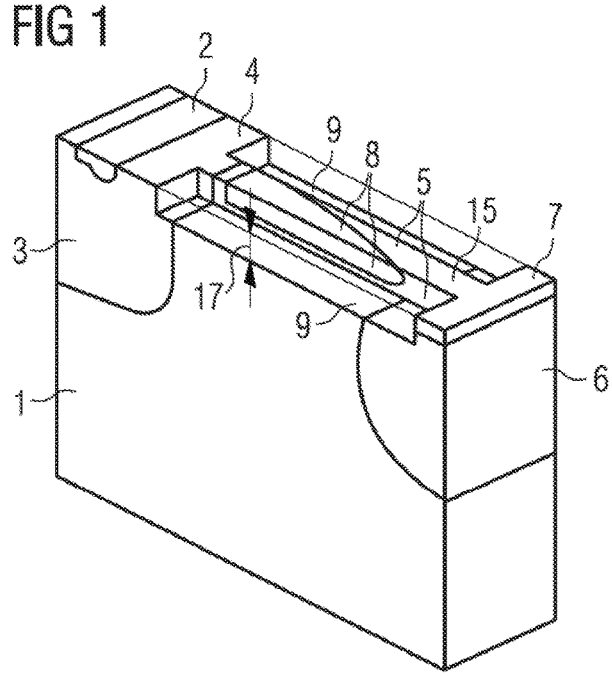
FIG. 1 shows a perspective cross-section of an embodiment of the transistor device.

FIG. 1 shows a high-voltage transistor device in a perspective cross-section. The device comprises a semiconductor substrate 1, which may be silicon, for example, with doped regions, which are arranged at or near a main surface of the substrate 1. The doped regions include a source region 2, a body region 3 with a channel region 4 formed at a surface area of the body region 3, and a striplike drift region 5 extending from the channel region 4 to a drain region 6. The source region 2, the drift region 5, and the drain region 6 have a first type of electrical conductivity. A drain contact region 7 for an external electrical contact may be provided at the surface of the substrate 1 adjacent to the drift region 5, as shown in FIG. 1, or may be arranged at a distance from the drift region 5 on the drain region 6. The drain contact region 7 has the first type of electrical conductivity and preferably a higher doping concentration than the drain region 6. The higher doping concentration in the drain contact region 7 may especially be produced by an implantation of dopants for the drift region 5 if this implantation is simultaneously performed in the drain region 6. Additionally or instead there may be a dedicated implantation of high dose for the first type of electrical conductivity particularly for the formation of the drain contact region 7, either adjacent to the drift region 5 or at a distance from the drift region 5. The body region 3 is doped to have a second type of electrical conductivity, which is opposite to the first type of conductivity. The body region 3 and the drain region 6 can be produced as doped wells by an implantation of dopants for opposite types of conductivity. In a high-voltage NMOS transistor the first type of conductivity is n-type conductivity and the second type of conductivity is p-type conductivity.

In a high-voltage PMOS transistor the first type of conductivity is p-type conductivity and the second type of conductivity is n-type conductivity.

The drift region 5 is formed by a strip of semiconductor material in the shape of a fin or bar and is laterally confined by isolation regions 9, which are arranged at a distance from one another. The lateral width of the drift region 5 is thus defined by the distance between the isolation regions 9, which may be essentially constant along the longitudinal extension of the drift region 5. In FIG. 1 the isolation regions 9 are represented as if they were transparent in order to show the shape and position of the drift region 5. An upper surface of the drift region 5 may be a striplike area 15 of essentially constant width. This striplike area 15 may be covered by a thin dielectric layer, especially by an oxide of the semiconductor material, which may also be used as a gate dielectric insulating the gate electrode from the semiconductor material. The isolation regions 9 may be formed by shallow trench isolations (STI), especially with an oxide of the semiconductor material. The vertical dimension or depth of the drift region 5 does not exceed the maximal depth 17 of the isolation regions 9. The drift region 5 is thus limited on both lateral sides completely by the boundaries of the isolation regions 9.

The electrical properties of the drift region 5 are modified and adjusted by an adjustment region 8 with a net doping of the second type of electrical conductivity, which is included in the drift region 5 and does not exceed the depth 17 of the isolation regions 9 either. The maximal depth of the adjustment region 8 may be less than the depth of the drift region 5, so that a net doping of the first type of conductivity is present in a lower layer portion of the drift region 5, as indicated in FIG. 1. By means of the adjustment region 8 a graded electrical conductivity can be achieved within the drift region 5.

Figure 2:
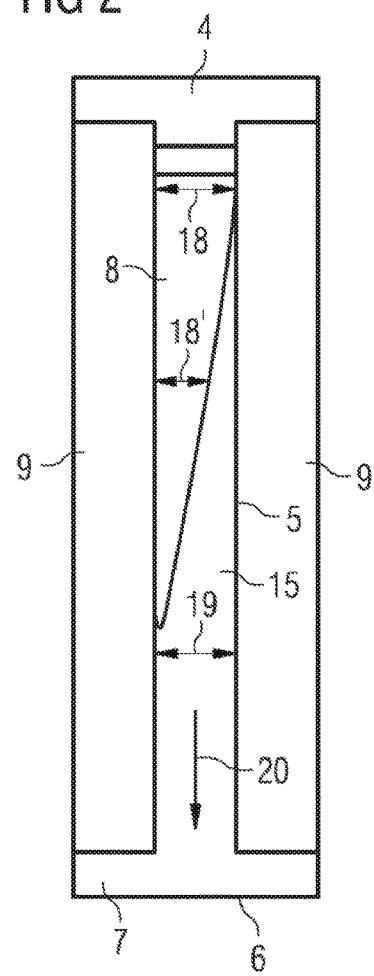
FIG. 2 shows a section of a top view encompassing the area of a drift region.

FIG. 2 shows a section of a plan view of the device, encompassing the area of the striplike drift region 5 extending longitudinally from the channel region 4, which abuts one end of the drift region 5, to the drain region 6 or the drain contact region 7 at the opposite end. The drift region 5 is limited on both lateral sides by the isolation regions 9, so that the surface of the drift region 5 is a striplike area 15. The direction of longitudinal extension 20 is indicated in FIG. 2 with an arrow. The distance 19 between the isolation regions 9 may be constant along the drift region 5.

The adjustment region 8 is tapered in the embodiment according to FIGS. 1 and 2. The lateral width 18, 18' of the adjustment region 8 decreases in the direction from the channel region 4 towards the drain region 6. The areas of the cross-sections of the adjustment region 8 which are perpendicular to the longitudinal extension 20 of the drift region 5 thus decrease with increasing distance from the channel region 4 and decreasing distance from the drain region 6.

The maximal lateral width 18 of the adjustment region 8 may be equal to the distance 19 between the isolation regions 9 and hence equal to the lateral width of the drift region 5, as in the example shown in FIG. 2, or the maximal lateral width 18 of the adjustment region 8 may be smaller than the distance 19 between the isolation regions 9. The adjustment region 8 may be arranged at a distance from the channel region 4 or at a distance from the drain region 6 or, as in the embodiment according to FIGS. 1 and 2, at distances both from the channel region 4 and from the drain region 6.

Figure 3:
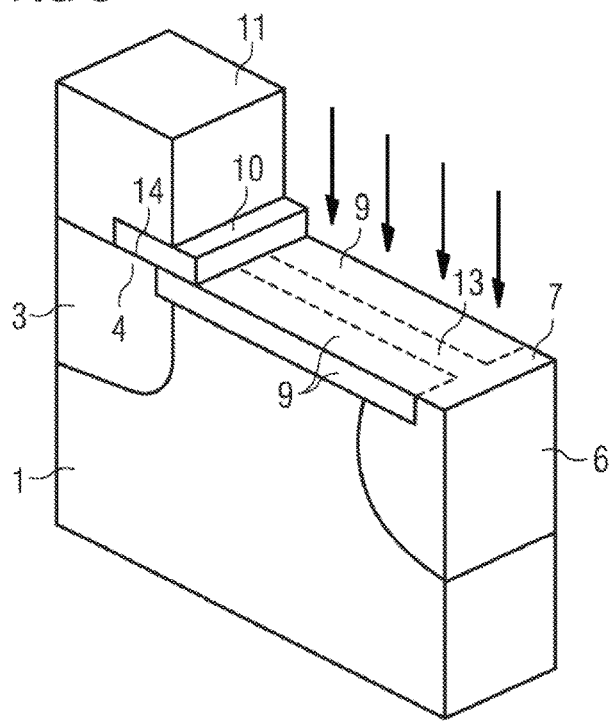
FIG. 3 shows a cross-section according to FIG. 1 for a state of production.

FIG. 3 shows a perspective cross-section according to FIG. 1 for a process state of the method of producing the transistor device. At a main surface of a semiconductor substrate 1, the body region 3 and the drain region 6 are formed, preferably as doped wells of opposite types of conductivity by implantations of different dopants. Between the body region 3 and the drain region 6 the isolation regions 9 are arranged in parallel at a distance from one another.

The isolation regions 9 may be formed as shallow trench isolations by etching shallow trenches, which are subsequently filled with an insulating or dielectric material, particularly with an oxide of the semiconductor material. Shallow trench isolations are preferably produced before the implantations of the doped wells. In embodiments of the device the distance 19 between the isolation regions 9 may lie in the range between 0.3 μm and 0.7 μm or may be restricted to the range between 0.4 μm and 0.6 μm. The distance 19 may be typically 0.5 μm, for example.

FIG. 3 shows a thin cover layer 13 on the substrate 1 between the isolation regions 9. The cover layer 13 may comprise the same material as the isolation regions 9, especially an oxide of the semiconductor material. The boundaries between the isolation regions 9 and the substrate region that is provided for the drift region 5 are indicated in FIG. 3 with broken lines as hidden contours under the cover layer 13. The material of the cover layer 13 may also be provided as a gate dielectric 14 to insulate the gate electrode 10, which is arranged above the channel region 4, from the semiconductor material. The gate electrode 10 may be polysilicon, for instance.

A first mask 11, which may be a resist, is applied for a subsequent implantation of a dopant for the first type of conductivity in the drift region 5, as indicated by the arrows in FIG. 3. The implantation is preferably performed in a way which is self-aligned with respect to the gate electrode 10. The implantation depth does not exceed the depth 17 of the isolation regions 9.

Figure 4:
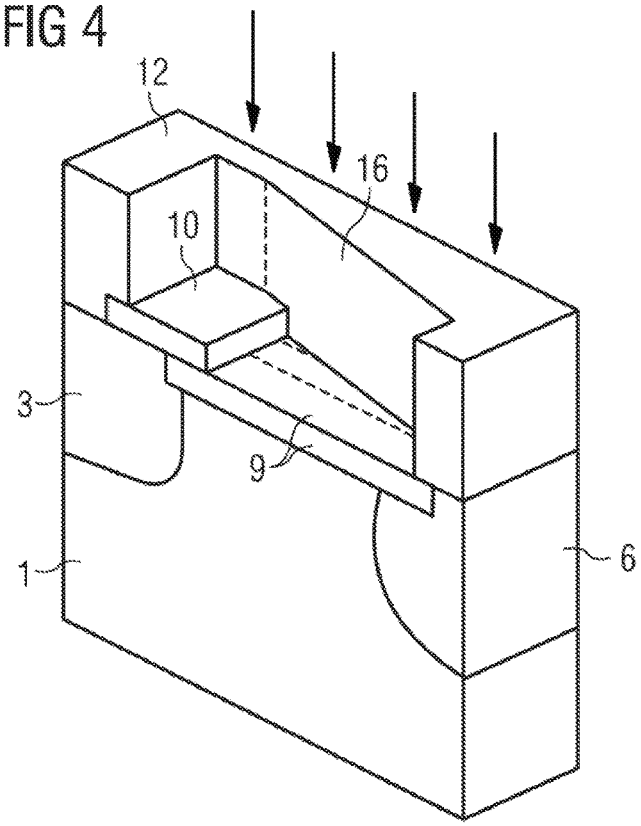
FIG. 4 shows a cross-section according to FIG. 3 for a further state of production.

FIG. 4 shows a perspective cross-section according to FIG. 3 for a further process state after the first mask 11 has been substituted with a second mask 12, which may be a resist as well. The lateral edge 16 limiting the opening of the second mask 12 is arranged obliquely with respect to the longitudinal extension 20 of the drift region 5, which means that the edge 16 runs neither in parallel nor perpendicularly to the longitudinal extension 20 of the drift region 5. An implantation of a dopant for the second type of conductivity is then performed in the drift region 5, as indicated by the arrows in FIG. 4. This implantation may also be performed in a way which is self-aligned with respect to the gate electrode 10. The implantation depth does not exceed the depth 17 of the isolation regions 9 and may be shallower than the previous implantation of the dopant for the first type of conductivity. The implantation of the dopant for the second type of conductivity is provided to produce the adjustment region 8 within the drift region 5, according to the shape of the second mask 12.

If the oblique edge 16 of the second mask 12 traverses the total width of the striplike area 15 between the isolation regions 9, the precision of the alignment of the second mask 12 is not critical, and a possible misalignment of the second mask 12 can be taken account of by a suitable definition of the length of the drift region 5. The implantations provided for the drift region 5 and for the adjustment region 8 render a net doping concentration in the drift region 5 which allows dropping the drain/source potential in a controlled way.

Figure 5:
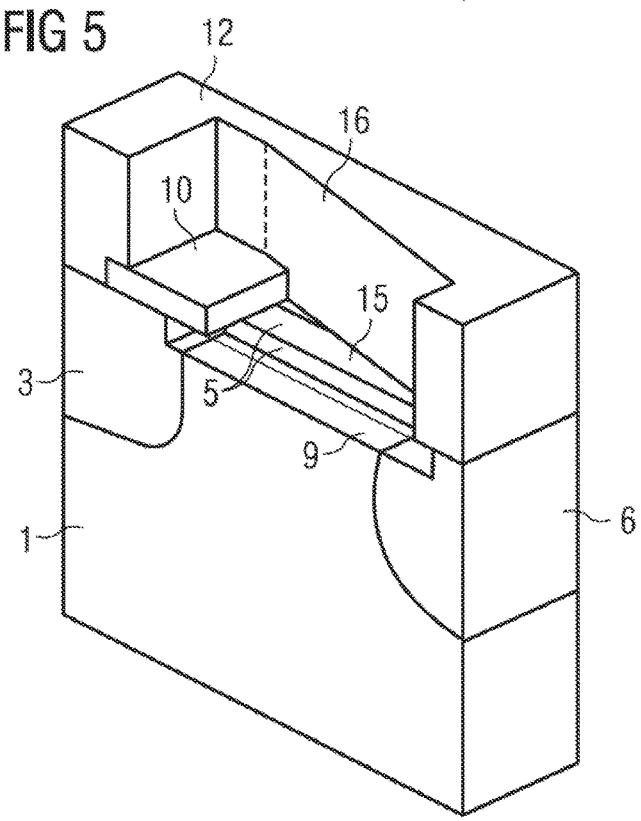
FIG. 5 shows the cross-section of FIG. 4 with the isolation regions represented as if being transparent.

FIG. 5 shows the perspective cross-section according to FIG. 4 with the isolation regions 9 and the cover layer 13 represented as if they were transparent, similar to FIG. 1. FIG. 5 shows the shape of the drift region 5 as a fin or bar and the tapering section of the striplike area 15 of the upper surface of the drift region 5 that is not covered by the second mask 12. The doping of the drift region 5 that is obtained by the preceding implantation is counterdoped at least in a section of the uncovered area in order to form the adjustment region 8 with a net doping of the second type of conductivity. The use of a second mask 12 having an opening that is limited by an edge 16 arranged obliquely with respect to the drain region 5 results in a tapering shape of the adjustment region 8 according to the embodiment shown in FIGS. 1 and 2.

If the high-voltage transistor device comprises a high-voltage NMOS transistor, for example, and the implantations of donor atoms for the drift region 5 and acceptor atoms for the adjustment region 8 have nearly the same depth and thus comparable profiles, a suitable net conductivity in the drift region 5 may be obtained by an effective dose, which is the difference between the dose of donor atoms and the dose of acceptor atoms, of more than 1·112 cm−2. If the implantation of acceptor atoms for the adjustment region 8 is shallower than the implantation of donor atoms, the donor concentration remaining below the adjustment region 8 should be equivalent to a dose of more than 1·112 cm−2.

A device having a larger width may comprise a plurality of striplike drift regions 5 arranged in parallel and separated by isolation regions 9 from one another. The drift regions 5 are provided with adjustment regions 8 as described above. In order to produce the adjustment regions 8, the dopant for the second type of conductivity may be implanted in the striplike areas 15 by means of a second mask 12 that has a plurality of parallel openings. Examples are shown in FIGS. 6 and 7.

Figure 6:
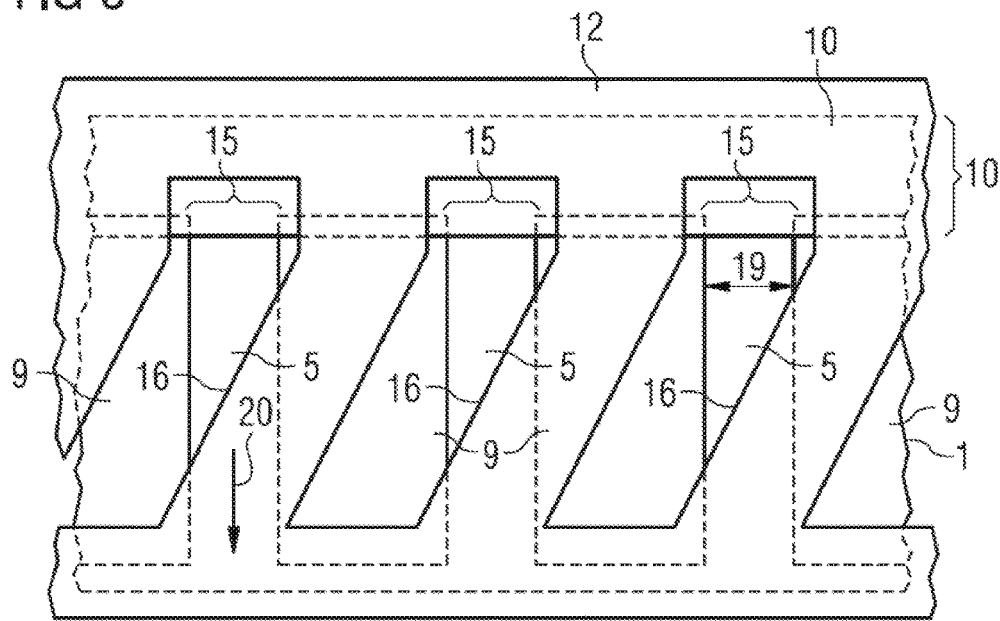
FIG. 6 shows a section of a top view of the transistor device covered with a periodic mask.

FIG. 6 shows a section of a top view of the transistor device covered with the second mask 12 above a section of the substrate 1 that is outlined with broken lines. The isolation regions 9 are arranged in the substrate 1 along essentially the same direction at a distance from one another and separated by parallel striplike regions that are provided as drift regions 5. The striplike areas 15 of the drift regions 5, indicated in FIG. 6 by braces, may laterally be limited by parallel boundaries if the isolation regions 9 have constant distances 19 from one another. The position of the gate electrode 10 with respect to the openings of the second mask 12 is also indicated in FIG. 6. The openings of the second mask 12 have boundaries which are oblique with respect to the longitudinal extension 20 of the drift region 5 at least above the striplike areas 15. The oblique edges 16 of the second mask 12 thus render tapered adjustment regions 8 as described above. The sequence of the oblique edges 16 that traverse the striplike areas 15 is preferably periodic, so that the oblique edges 16 are parallel to one another and arranged at equal distances. In the example of FIG. 6, the openings of the second mask 12 leave sections of the edge of the gate electrode 10 uncovered, so that the implantation of the dopant for the adjustment regions 8 is self-aligned with respect to the gate electrode 10.

Figure 7:
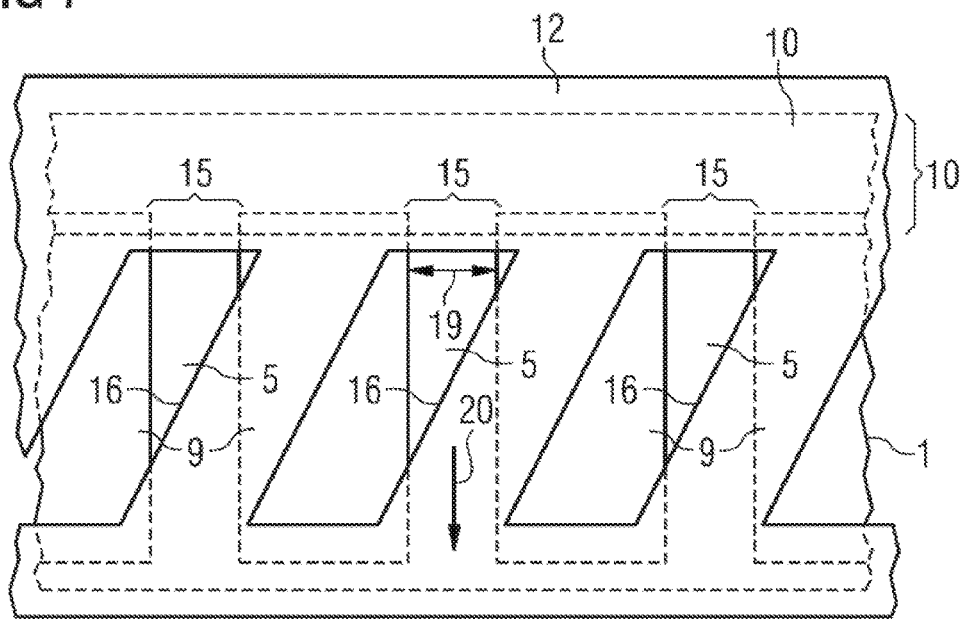
FIG. 7 shows a section of a top view according to FIG. 6 with a periodic mask of a different shape.

FIG. 7 shows a section of a top view according to FIG. 6 for another embodiment of the second mask 12, which completely covers the gate electrode 10. In the embodiment according to FIG. 7 the implantation of the dopant for the adjustment regions 8 is not self-aligned with respect to the gate electrode 10, but the dopant is implanted at a distance from the gate electrode 10. This may be favorable for some embodiments, depending on the lateral diffusion of the implanted dopants, especially if the implantation dose is high and/or the implantation angle is steep. The example of FIG. 7 may be preferred in these cases to secure that the arrangement of the adjustment regions 8 does not prevent the charge carriers from passing the drift region.

The invention claimed is:

1. A method of producing a high-voltage transistor device, comprising:
    forming isolation regions in a semiconductor substrate, the isolation regions confining a striplike area;
    forming a drain region of a first type of electrical conductivity and a body region of a second type of electrical conductivity, which is opposite to the first type of conductivity, at opposite ends of the striplike area;
    forming a gate electrode above the body region;
    implanting a dopant for the first type of conductivity in the striplike area;
    forming a source region of the first type of conductivity in the body region;
    the implantation being performed in such a way that the dopant for the first type of conductivity does not exceed a maximal depth of the isolation regions; and
    a dopant for the second type of conductivity being implanted in the striplike area in such a way that the dopant does not exceed the maximal depth of the isolation regions and a net doping of the second type of conductivity is obtained in an adjustment region, wherein
        a plurality of isolation regions are arranged parallel to one another confining a plurality of parallel striplike areas,
        a dopant for the first type of conductivity is implanted in the striplike areas to a maximal depth that does not exceed the maximal depth of the isolation regions,
        a dopant for the second type of conductivity is implanted in the striplike areas to a maximal depth that does not exceed the maximal depth of the isolation regions in such a way that a net doping of the second type of conductivity is obtained in adjustment regions, and
        the implantation of the dopant for the second type of conductivity in the striplike areas is performed by means of a mask having a plurality of parallel edges each traversing one of the striplike areas in a direction that is oblique to a longitudinal extension of the striplike area.

2. A method of producing a high-voltage transistor device, comprising:
    forming isolation regions in a semiconductor substrate, the isolation regions confining a striplike area;
    forming a drain region of a first type of electrical conductivity and a body region of a second type of electrical conductivity, which is opposite to the first type of conductivity, at opposite ends of the striplike area;
    forming a gate electrode above the body region;
    implanting a dopant for the first type of conductivity in the striplike area;
    forming a source region of the first type of conductivity in the body region;
    the implantation being performed in such a way that the dopant for the first type of conductivity does not exceed a maximal depth of the isolation regions;
    a dopant for the second type of conductivity being implanted in the striplike area in such a way that the dopant does not exceed the maximal depth of the isolation regions and a net doping of the second type of conductivity is obtained in an adjustment region; and
    the adjustment region being produced having a tapered shape with different lateral widths in such a way that these lateral widths decrease in the direction from the channel region towards the drain region.

3. A method of producing a high-voltage transistor device, comprising:
    forming isolation regions in a semiconductor substrate, the isolation regions confining a striplike area;
    forming a drain region of a first type of electrical conductivity and a body region of a second type of electrical conductivity, which is opposite to the first type of conductivity, at opposite ends of the striplike area;
    forming a gate electrode above the body region;
    implanting a dopant for the first type of conductivity in the striplike area;
    forming a source region of the first type of conductivity in the body region;
    the implantation being performed in such a way that the dopant for the first type of conductivity does not exceed a maximal depth of the isolation regions;
    a dopant for the second type of conductivity being implanted in the striplike area in such a way that the dopant does not exceed the maximal depth of the isolation regions and a net doping of the second type of conductivity is obtained in an adjustment region;
    the drift region being formed abutting a drain contact region; and
    the adjustment region being arranged at a distance from the drain contact region.

4. The method of claim 2 or 3, wherein the adjustment region is formed using a mask having an opening that is limited by an edge arranged obliquely with respect to a longitudinal extension of the striplike area to implant the dopant for the second type of conductivity in the striplike area.

5. The method of claim 2 or 3, wherein the adjustment region is formed using a mask that completely covers the gate electrode.

6. The method of claim 2 or 3, wherein the implantations of the dopants for the first and second types of conductivity in the striplike area between the isolation regions are performed in a way that is self-aligned with respect to the gate electrode.

7. The method of claim 2 or 3, wherein
    a plurality of isolation regions are arranged parallel to one another confining a plurality of parallel striplike areas;
    a dopant for the first type of conductivity is implanted in the striplike areas to a maximal depth that does not exceed the maximal depth of the isolation regions; and
    a dopant for the second type of conductivity is implanted in the striplike areas to a maximal depth that does not exceed the maximal depth of the isolation regions in such a way that a net doping of the second type of conductivity is obtained in adjustment regions.

8. The method of claim 7, wherein the implantation of the dopant for the second type of conductivity in the striplike areas is performed by means of a mask having a plurality of parallel edges each traversing one of the striplike areas in a direction that is oblique to a longitudinal extension of the striplike area.

* * * * *